United States Patent [19]
Beckert et al.

[11] Patent Number: 5,218,290
[45] Date of Patent: Jun. 8, 1993

[54] MULTI-FUNCTION, MULTI-MODE SWITCH FOR AN INSTRUMENT

[75] Inventors: Richard D. Beckert, Everett; William F. Rasnake, Bothell, both of Wash.

[73] Assignee: John Fluke Mfg. Co., Inc., Everett, Wash.

[21] Appl. No.: 648,276

[22] Filed: Jan. 31, 1991

[51] Int. Cl.$^5$ .............................................. G01R 15/08
[52] U.S. Cl. .................................. 324/115; 324/99 D; 364/483
[58] Field of Search ..................... 324/115, 116, 99 D, 324/99 R, 142, 121 R, 133, 103 R; 340/660, 661, 662, 663, 540, 712; 341/139, 155; 364/483

[56] References Cited

U.S. PATENT DOCUMENTS

| | | | |
|---|---|---|---|
| 4,023,101 | 5/1977 | Christoffer | 324/115 |
| 4,321,530 | 3/1982 | Kelly et al. | 324/133 |
| 4,604,569 | 8/1986 | Tedd et al. | 324/115 |
| 5,004,975 | 4/1991 | Jordan | 324/121 R |
| 5,119,019 | 6/1992 | George | 324/115 |
| 5,142,221 | 8/1992 | Meldrum et al. | 324/115 |

OTHER PUBLICATIONS

Hioki Digital Hi Tester; "New Concept Digital Multimeters"; pp. 1-4; 1980 Cat. No. 3207E.

Primary Examiner—Vinh Nguyen
Attorney, Agent, or Firm—Richard A. Koske

[57] ABSTRACT

A multi-function, multi-mode switch for an instrument that changes the instrument between primary and secondary functions and between first and second modes of operation within the primary and secondary functions. The instrument changes from the first mode of operation to the second mode of operation when the switch is actuated for a first period of time. The instrument changes from the second mode of operation to the first mode of operation when the switch is activated for a second period of time. The instrument changes between the primary and secondary functions when the switch is operated for a third period of time. The switch controls a program that instructs the instrument to perform the appropriate operations. The program also instructs the instrument to confirm that an operation has occurred via audible and visual feedback.

13 Claims, 2 Drawing Sheets

MULTI-FUNCTION, MULTI-MODE SWITCH FOR AN INSTRUMENT

BACKGROUND OF THE INVENTION

The present invention relates generally to switches, and more particularly, to switches for controlling various functions of test and measurement instruments.

The capabilities of test and measurement instruments, such as meters, oscilloscopes and signal generators, have increased significantly in recent years. Along with the growing capabilities has come a corresponding increase in the number of features with these instruments. Quite often these prior art instruments have a vast array of switches on their front panels which allow users to select any one of a number of desired functions. Unfortunately, these switches pose problems in that they add to the complexity of the instruments and, in some cases, make it difficult to operate the instruments as intended by the manufacturer. Furthermore, the number of switches may hinder efforts by manufacturers to reduce the overall size of these instruments and lower manufacturing costs.

Handheld digital multimeters are an example of prior art test and measurement instruments whose capabilities have increased in recent years, but whose resulting complexity has made user operation more difficult and manufacturing costs more expensive. For example, the increased capabilities in these instruments typically results in additional switches on the front of the multimeter, which make one-handed operation difficult. This is partly due to the simple fact that there are too many switches for the user to easily operate with just one hand, and one-handed operation is a highly desirable feature for handheld instruments. Also, the additional switches may require increasing the size of the multimeter, which further hinders one-handed operation. Lastly, the additional switches and increased size raise the cost of manufacturing the multimeters.

Accordingly, there is a need for test and measurement instruments that are easy to operate and which are relatively inexpensive to manufacture. The present invention is directed to a multi-function, multi-mode switch for an instrument, which is designed to achieve these results.

SUMMARY OF THE INVENTION

A multi-function, multi-mode switch for an instrument having function selection capability for selecting one of a plurality of primary functions, wherein operation of the multi-function, multi-mode switch may cause the instrument to change between a selected one of the primary functions and a secondary function associated with the selected primary function. Operation of the multi-function, multi-mode switch may also cause the instrument to change between a first mode of operation and a second mode of operation within the selected primary function and the associated secondary function.

In accordance with further aspects of the present invention, actuating the multi-function, multi-mode switch for a first period of time causes the instrument to change from the first mode of operation to the second mode of operation, actuating the multi-function, multi-mode switch for a second period of time causes the instrument to change from the second mode of operation to the first mode of operation, and activating the multi-function, multi-mode switch for a third period of time causes the instrument to change between the selected primary function and the associated secondary function.

In accordance with still further aspects of the present invention, the first mode of operation is an automatic range mode, wherein the instrument automatically selects the proper range for the parameter being measured and the second mode of operation is a manual range mode, wherein the proper range is manually selected. Actuating the multi-function, multi-mode switch for the first period of time while the instrument is in the manual range mode changes the range of the instrument.

In accordance with yet further aspects of the present invention, audible and visual feedback is produced by the instrument to confirm that changes between the selected primary function and the associated secondary function have occurred, and that changes between the first mode of operation and the second mode of operation have occurred.

In accordance with still further aspects of the present invention, a method for implementing in an instrument a primary function and a secondary function, and first and second modes of operation within each of the primary and secondary functions with a multi-function, multi-mode switch, wherein the method includes the steps of: initiating a first operation of the instrument when the multi-function, multi-mode switch is activated for a first period of time, whereby the instrument changes from the first mode of operation to the second mode of operation; initiating a second operation of the instrument when the multi-function, multi-mode switch is activated for a second period of time, whereby the instrument switches from the second mode of operation to the first mode of operation; and initiating a third operation of the instrument when the multi-function, multi-mode switch is activated for a third period of time, whereby the instrument switches between the primary and secondary functions.

As will be appreciated from the foregoing summary, the present invention provides a multi-function, multi-mode switch that switches an instrument between primary and secondary functions and between first and second modes of operation within the primary and secondary functions.

BRIEF DESCRIPTION OF THE DRAWINGS

The foregoing and other advantages of this invention will become more readily appreciated as the same becomes better understood by reference to the following detailed description taken in conjunction with the accompanying drawings, wherein.

DESCRIPTION OF THE PREFERRED EMBODIMENT

In the description that follows, a preferred embodiment of the present invention is incorporated into a handheld digital multimeter, examples of which include the 70 series multimeters manufactured by John Fluke Mfg. Co., Inc., Everett, Wash., U.S.A. However, the use of a digital multimeter is intended only to be illustrative of test and measurement instruments that may incorporate the present invention. Accordingly, it is to be understood that the present invention may be practiced with test and measurement instruments other than handheld digital multimeters.

Figure 1:
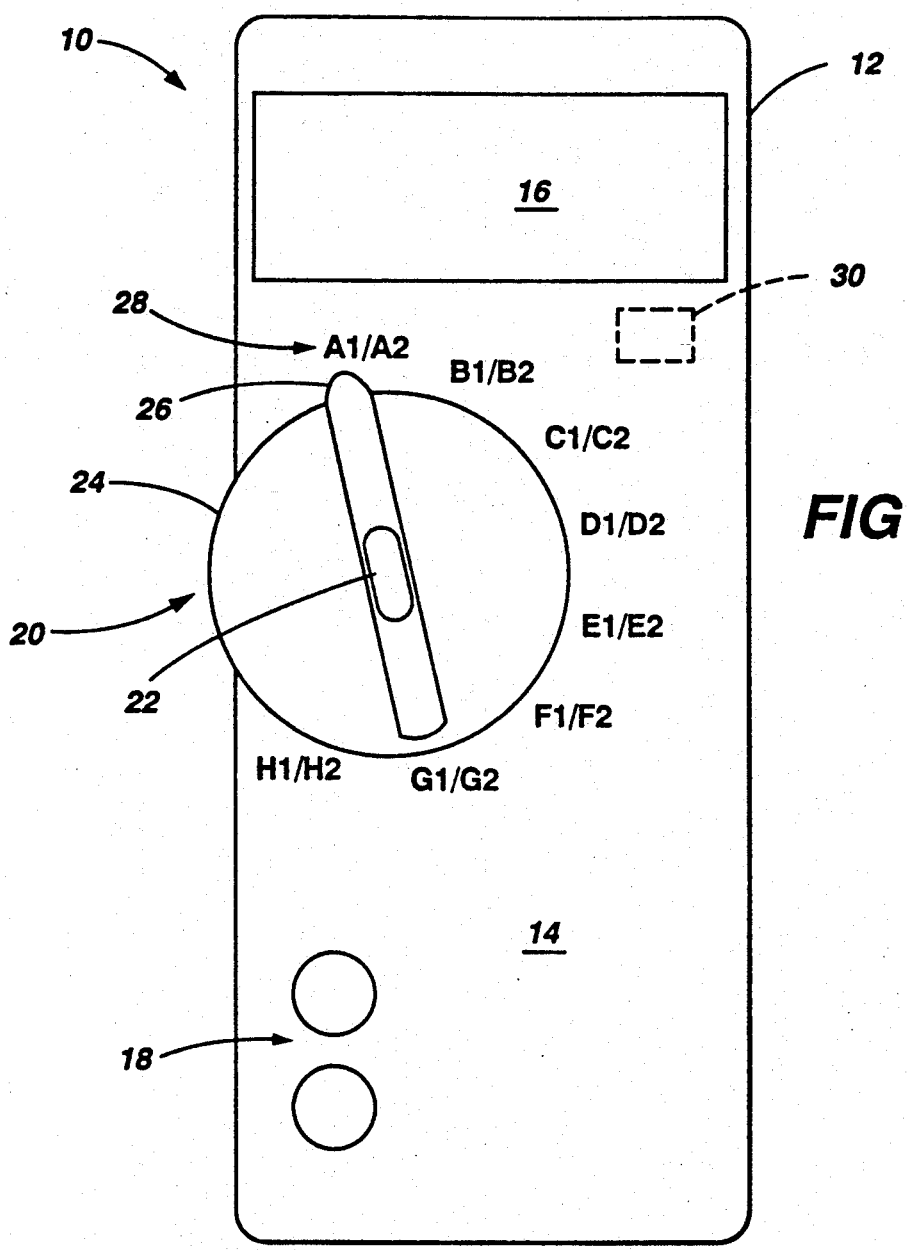
FIG. 1 is a front view of a handheld multimeter incorporating a multi-function, multi-mode switch formed in accordance with a preferred embodiment of the present invention.

Turning first to FIG. 1, there is illustrated a handheld digital multimeter (hereinafter DMM) 10 having incorporated therein a preferred embodiment of a multi-function, multi-mode switch formed in accordance with the present invention. In its presently preferred embodiment, the multi-function, multi-mode switch is in the form of a pushbutton (hereinafter button) 22. In a manner discussed more fully below, operation of the button 22 changes the DMM 10 between selected primary and secondary measurement functions and between first and second modes of operation within the selected primary or secondary measurement functions. The DMM 10 further includes a case 12 that is sized to easily fit into one hand of a person using the meter. Located on a front face 14 of the case 12 is a display 16 for displaying a readout of the parameter being measured, jacks 18 for connecting a probe (not shown) to the DMM 10 for sensing the parameter to be measured, and a rotary switch (hereinafter switch) 20 for selecting an appropriate measurement function. Located within the DMM 10 is a circuit 30 for producing electronic sounds, such as single and multiple beeps of varying duration. The circuit 30 is illustrated graphically in FIG. 1 by a dashed block. Such circuits are well known and, hence, are not discussed in detail herein.

The switch 20 includes a rotary knob 24 and an indicator 26. The button 22 (i.e., the multi-function, multi-mode switch) is located along the indicator 26 in the center of the switch 20. As oriented in FIG. 1, the switch 20 is located near the left side of the DMM 10. Preferably, the rotary knob 24 of the switch 20 protrudes slightly beyond the left side of the DMM 10. As is well known to practitioners of ordinary skill in the multimeter art, these positions of the switch 20 and button 22 allow a person to operate the DMM 10 with one hand. For example, a person holding the DMM 10 in his or her left hand could rotate the switch 20 by turning the knob 24 with the thumb of the left hand, thereby, keeping the right hand free to hold a measurement probe. Likewise, the button 22 can be pressed with the same thumb.

The DMM 10 is capable of numerous measurement functions that are addressable by the switch 20. The various functions, denoted in FIG. 1 as A1/A2, B1/B2, C1/C2, D1/D2, E1/E2, F1/F2, G1/G2 and H1/H2, are printed on the front face 14 around the perimeter of the switch 20, where A1-H1 represent primary measurement functions and A2-H2 represent secondary functions. Table A, below, lists examples of these primary and secondary measurement functions.

TABLE A

| SWITCH POSITION | PRIMARY FUNCTION (1) | SECONDARY FUNCTION (2) |
|---|---|---|
| A | OFF | — |
| B | AC VOLTS | HOLD |
| C | FREQUENCY | — |
| D | DC VOLTS | HOLD |
| E | DC MILLIVOLTS | HOLD |
| F | OHMS | CAPACITANCE |
| G | LOW OHMS | DIODE TEST |
| H | DC AMPS | AC AMPS |

In Table A, above, the HOLD function causes the DMM 10 to lock a measured value of the parameter onto the display and update the display for new, stable measurements. The LOW OHMS function places the DMM 10 in condition to measure very low values of resistance with a high degree of precision. The remaining functions are self explanatory. It should be understood that the particular functions listed in Table A are merely illustrative of measurement functions that may be performed by a multimeter and, hence, they are not to be construed as limiting to the present invention. The particular functions performed by the DMM 10 (or for that matter any other instrument) do not form a part of the present invention and, therefore, are not discussed in further detail herein.

Multimeters of the type discussed above and illustrated in FIG. 1 are well known to technicians and other persons having ordinary skill in the test and measurement field and, hence, a detailed description of their operation may be found in other publications, such as instrument instruction manuals for example. In any event a detailed description of their operation is not duplicated herein. However, a brief description is provided so as to permit a better understanding the present invention. Basically, the DMM 10 performs the measurement function corresponding to the particular switch position to which the switch 20 is rotated. For example, the DMM 10 depicted in FIG. 1 is turned off when switch 20 is in position A1/A2, that is, when the indicator 26 is adjacent A1/A2. Similarly, the DMM 10 is set to measure ohms or capacitance when the switch is in the F1/F2 position. Preferably, the DMM 10 defaults to one of the corresponding measurement functions each time the switch 20 is rotated to a different position. It is assumed, for purposes of illustrating the presently preferred embodiment of the invention, that the DMM 10 defaults to the primary function. Accordingly, in the above example, when the switch is moved to the F1/F2 position, the DMM 10 defaults to the F1 function, which in this example is the resistance measurement function (OHMS).

As was briefly noted above, the measurement functions of the DMM 10 have first and second modes of operation. In one line of commercially available multimeters, such as the 70 series multimeters manufactured by John Fluke Mfg., Inc., noted above, these first and second modes are automatic and manual range selection. In the automatic mode the meter automatically selects the range that will provide the most accurate reading of the parameter being measured. On the other hand, when the instrument is in the manual mode, the user selects the most appropriate range. Once again, for purposes of illustration, it is assumed that the DMM 10 defaults to the first mode of operation when either a primary or secondary measurement function is first selected. Thus, in keeping with the above example, the DMM 10 defaults to the automatic range within the ohms measurement function when the switch is rotated to the F1/F2 position. Clearly, the particular defaulting operation of the DMM 10, or other instrument, is not critical to the present invention, and the above example is not to be considered a limitation to the present invention.

As noted above, a user can change the DMM 10 between selected primary and secondary measurement functions and between first and second modes of operation within the primary and secondary functions by pressing the button 22. In keeping with the present example, the user can select between resistance and capacitance measurement by pressing the button 22. In addition, the user can also select between automatic and manual range modes within either measurement function. Further, when the DMM 10 is in the manual mode, the user may press the button 22 and select an appropriate range.

Pressing the button 22 also causes the DMM 10 to provide feedback to the user. This feedback includes an indication, i.e., confirmation, that a change in measurement function or mode of operation has occurred as well as an indication as to the type of function and mode of operation. In the particular embodiment of the invention discussed above, the feedback includes both audible and visual feedback. The audible feedback includes electronic beeps generated by circuit 30 and the visual feedback includes icons and possibly other symbols appearing in the display 16. The manner by which the button 22 causes the DMM 10 to provide this feedback is discussed more fully below.

While the preferred embodiment depicted in FIG. 1 illustrates button 22 as being located in the center of the switch 20, it is to be understood that other locations are equally suitable. It is preferable, however, that the button 22 be located so that the user can easily operate it with the same hand that holds the DMM 10. For example, button 22 could be located on the left side of the DMM 10 as oriented in FIG. 1, or near the left edge of the front face 14. Likewise, if onehanded operation is not considered important, such as in the case of bench top instruments, the particular location of the multi-function, multi-mode switch on the instrument may be of no consequence. Accordingly, the location of the button 22 is not critical to the present invention. Similarly, while the preferred embodiment of the multi-function, multi-mode switch is described above and depicted in FIG. 1 as a pushbutton, it is to be understood that other types of buttons or switches may be used. For example, button 22 may be a spring loaded slide switch, rotary switch or rocker switch. In any event, the button 22 of the present invention may be other than a pushbutton.

Figure 2:
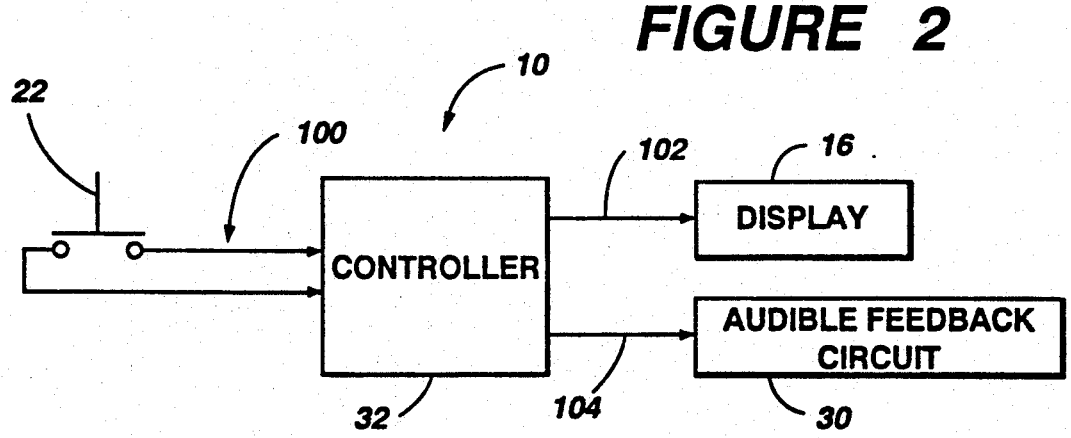
FIG. 2 is a simplified block diagram illustrating important features of the multimeter depicted in FIG. 1.

Illustrated in FIG. 2, in simplified block diagram form, is a portion of the DMM 10 discussed above. For purposes of clarity, like components common to FIGS. 1 and 2 are given the same reference numbers. Button 22 is connected to a controller 32 via signal lines 100. The controller is connected to the display 16 and the circuit 30. The controller 32 may be a microprocessor or other type of general or special purpose controller that, preferably, is used to control various functions of the DMM 10. For example, the controller 32 may set up the DMM 10 to perform a desired measurement function by controlling the operation of appropriate switches, which in turn place an analog-to-digital converter in the DMM 10 in the proper configuration for the desired measurement. As will be discussed more fully below, the controller executes a program (FIG. 3) that allows the DMM 10 to operate in accordance with the present invention. That is, the program instructs the DMM 10 to change between primary and secondary functions and between first and second modes of operation within the primary and secondary functions, in response to operation of the button 22. In addition, the program instructs the DMM 10, via the controller 32, to provide feedback to the user confirming that such a change has taken place. As noted above, the DMM 10 provides both audible and visual feedback, via circuit 30 and display 16, respectively. Accordingly, when the program instructs the DMM 10 to provide feedback, the controller 32 applies appropriate signals to the circuit 30 and display 16, thereby resulting in audible and visual indications of a change in measurement function or mode of operation.

Figure 3:
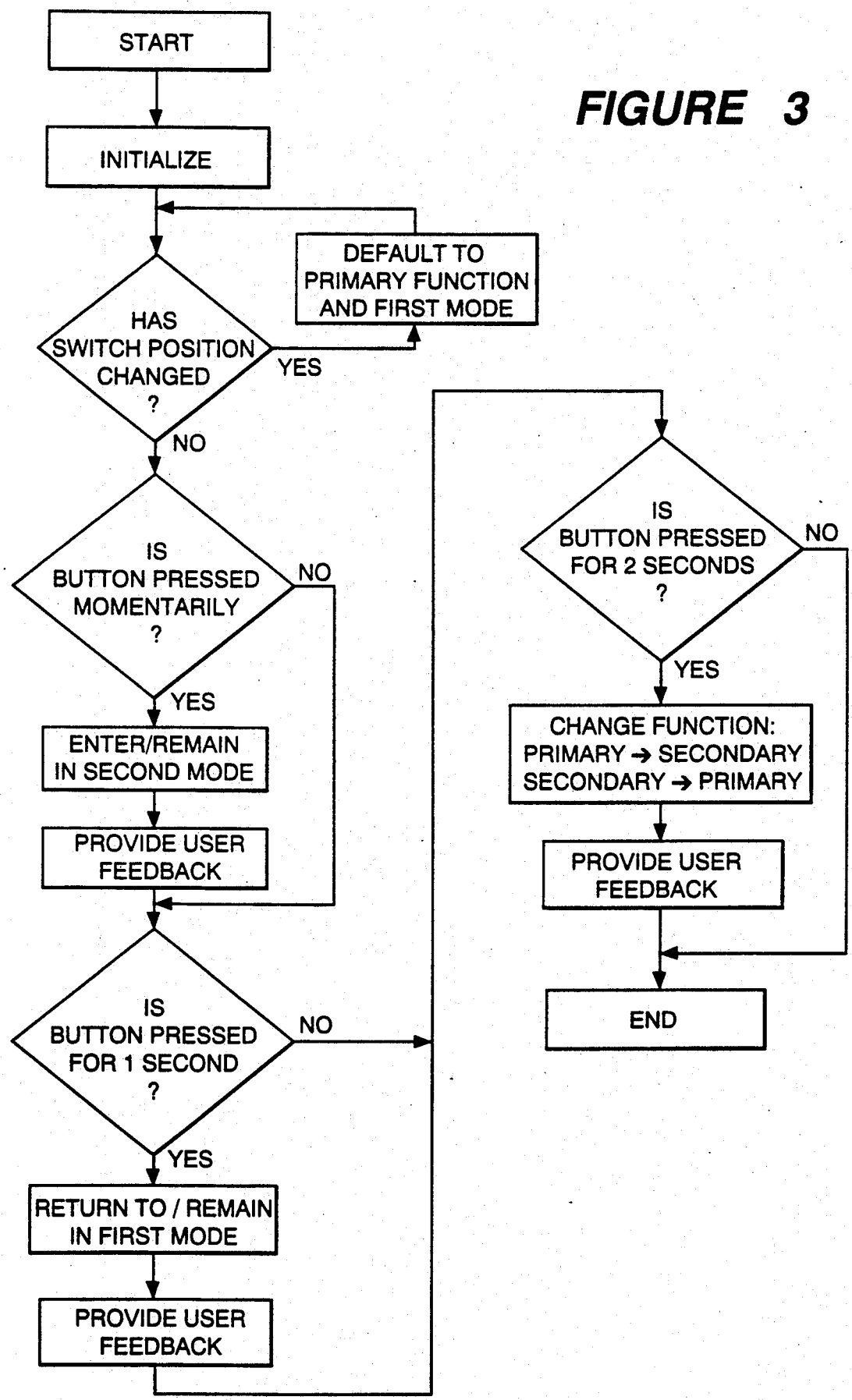
FIG. 3 is a flow chart illustrating various functional steps of a program executed by a controller within the multimeter of FIG. 1 for changing the multimeter between primary and secondary measurement functions and between first and second modes of operation within the primary and secondary measurement functions, wherein the steps are determined in part by the operation of the multi-function, multi-mode switch depicted in FIG. 1.

Turning next to FIG. 3, there is a flow chart depicting various functional steps of a program executed by the DMM 10 for determining which measurement function is to be performed. As will become better understood from the following discussion, the program steps are determined in part by the operation of the multi-function, multi-mode switch (e.g., button 22).

When the DMM 10 is turned on, the program begins, which is depicted as the START step in FIG. 3. Once the program has begun, it instructs the DMM 10 to perform various preliminary operations, shown figuratively as the INITIALIZE step. During this step, the DMM 10 sets various components, such as registers, counters and program flags, to initial states in preparation for performing a particular measurement function.

Next the program determines whether the switch position has changed. When the switch 20 has been rotated to a different position, the program proceeds to instruct the DMM 10 to default to the new primary function corresponding to the switch position and to default to the first mode of operation within the newly selected primary function. This process repeats until the program determines that the switch position has not changed, at which point the program proceeds to the step discussed next.

During the next step the program determines whether the button 22 (i.e., the multi-function, multi-mode switch) has been pressed momentarily. If the button has been pressed momentarily, the program instructs the meter to enter, or remain in, the second mode within the selected primary function. A momentary press of the button 22 may, for example, place the meter in the manual range mode of the ohms measurement function. As noted above, subsequent momentary presses of button 22, while the DMM 10 is in the manual mode (i.e., second mode) will change the range of the DMM 10. The program then instructs the DMM 10 to confirm this operation via feedback to the user. Preferably, this feedback includes a first audible indication, such as, a short beep from circuit 30, and a first visual indication, such as a distinctive icon that appears on the display 16. Thus, the feedback provides audible and visual confirmation that the DMM 10 has been placed in, or remains in, a second mode of operation.

Once the program has instructed the meter to provide the preceding feedback, or if the program determines that the button 22 has not been pressed momentarily, the program determines whether the button 22 has been pressed for one second. If the button 22 has been pressed for one second, the program instructs the meter to return to the first mode within the selected primary function. If the meter is already in the first mode, the meter is instructed to remain in the first mode. In keeping with the above example, the meter during this step either returns or remains in the automatic range selection mode of the ohms measurement function. Once again, the program instructs the DMM 10 to confirm this change via feedback to the user. This time the feedback preferably includes a second audible indication, such as a long beep from circuit 30, and a second visual indication, such as a distinctive icon on the display 16. Thus, this feedback provides audible and visual confirmation that the DMM 10 has been placed in, or remains in, a first mode of operation.

Once the program instructs the meter to provide this feedback (discussed in the preceding paragraph), or if the program determines that the button 22 has not been pressed for one second, the program determines whether the button 22 has been pressed for two seconds. If the button has been pressed for two seconds, the program instructs the meter to change functions. That is, if the meter is set up to perform a primary measurement function, the meter switches to the related secondary function, and vice versa. In the above example, with the switch in the OHMS/CAPACITANCE (F1/F2) position, the meter will either switch from ohms to capacitance measurement or from capacitance to ohms measurement depending on which function the meter is in when the button is pressed for two seconds. Next, the program instructs the DMM 10 to confirm this change via feedback to the user. The feedback preferably includes a third audible indication, such as two long beeps from circuit 30, and a third visual indication, such as a distinctive icon on the display 16. Thus, this feedback provides audible and visual confirmation that the DMM 10 has changed between primary and secondary functions. Once these instructions have been given, the program ends.

While a preferred embodiment of the present invention has been illustrated and described generally and by way of example, it will be appreciated that various changes can be made therein without departing from the spirit and scope of the invention. For example, the particular functions and modes within the functions are not critical to this invention. Rather, multi-function, multi-mode switch of the present invention may be implemented with any type of instrument that performs some or all of the above-described functions or different test or measurement functions. Further, a greater or lesser number of functions may be incorporated into the instrument. For example, additional functions may be added to each switch position, resulting in three or more functions at each position. The program could easily be modified so that the meter would change between the three or more functions by, for example, pressing the button for successive two second intervals. In addition, the particular time intervals for activating the different features of the button, i.e., the momentary, one and two second periods, could be different than as described herein. Likewise, the confirming feedback could be different. For example, only audible or only visual indications may be produced by the instrument, or all three audible signals could be the same if distinctions between particular measurement functions and operating modes is not deemed necessary. Consequently, the invention can be practiced otherwise than as specifically described herein.

We claim:

1. An instrument responsive to an electrical parameter comprising:
   (a) function selecting means for selecting a primary function of the instrument and a corresponding secondary function of the instrument; and
   (b) a multi-function, multi-mode switch that is capable of switching the instrument between said selected primary and corresponding secondary functions and between first and second modes of operation within each of said selected primary and corresponding secondary functions, such that:
      (i) a first operation of said multi-function, multi-mode switch changes the instrument from a first mode of operation to a second mode of operation within one of said selected primary and corresponding secondary functions;
      (ii) a second operation of said multi-function, multi-mode switch changes the instrument from said second mode of operation to said first mode of operation; and
      (iii) a third operation of said multi-function, multi-mode switch changes the instrument between said selected primary function and said corresponding secondary function.

2. An instrument according to claim 1, wherein said first operation of said multi-function, multi-mode switch occurs when said multi-function, multi-mode switch is actuated for a first time period; said second operation of said multi-function, multi-mode switch occurs when said multi-function, multi-mode switch is actuated for a second time period; and said third operation of said multi-function, multi-mode switch occurs when said multi-function, multi-mode switch is actuated for a third time period.

3. An instrument according to claim 2, wherein the instrument further includes feedback means responsive to said operations of said multi-function, multi-mode switch for confirming that one of said first, second and third operations of said multi-function, multi-mode switch has occurred.

4. An instrument according to claim 3, wherein said feedback means includes a circuit coupled to said multi-function, multi-mode switch that produces a first audible indication when said first operation of said multi-function, multi-mode switch has occurred, a second audible indication when said second operation of said multi-function, multi-mode switch has occurred, and a third audible indication when said third operation of said multi-function, multi-mode switch has occurred.

5. An instrument according to claim 3, wherein said feedback means includes a display coupled to said multi-function, multi-mode switch that produces a first visual indication when said first operation of said multi-function, multi-mode switch has occurred, a second visual indication when said second operation of said multi-function, multi-mode switch has occurred, and a third visual indication when said third operation of said multi-function, multi-mode switch has occurred.

6. An instrument according to claim 2 wherein said multi-function, multimode switch is a pushbutton.

7. An instrument according to claim 2, wherein the instrument is a digital multimeter capable of measuring the electrical parameter and has range selection capability for selecting an appropriate measurement range depending on the value of the parameter being measured and, wherein said first mode of operation is an automatic mode in which the instrument automatically selects an appropriate measurement range and said second mode of operation is a manual mode in which an appropriate measurement range is manually selected.

8. An instrument according to claim 7, wherein said first operation of said multi-function, multi-mode switch changes the measurement range when the instrument is already in said manual mode.

9. An instrument according to claim 8, wherein the instrument further includes feedback means responsive to said operations of said multi-function, multi-mode switch for confirming that one of said first, second and third operations of said multi-function, multi-mode switch has occurred.

10. An instrument according to claim 9, wherein said feedback means include a circuit coupled to said multi-function, multi-mode switch that produces a first audible indication when said first operation of said multi-function, multi-mode switch has occurred, a second audible indication when said second operation of said multi-function, multi-mode switch has occurred, and a third audible indication when said third operation of said multi-function, multi-mode switch has occurred.

11. An instrument according to claim 9, wherein said feedback means includes a display coupled to said multi-function, multi-mode switch that produces a first visual indication when said first operation, of said multi-function, multi-mode switch has occurred, a second visual indication when said second operation of said multi-function, multi-mode switch has occurred, and a third visual indication when said third operation of said multi-function, multi-mode switch has occurred.

12. In an instrument, a method for implementing a primary function and a secondary function and first and second modes of operation within said primary and secondary functions with a multi-function, multi-mode switch, said method comprising the steps of:
(a) operating said multi-function, multi-mode switch for a first period of time, so as to change the instrument from said first mode of operation to said second mode of operation;
(b) operating said multi-function, multi-mode switch for a second period of time, so as to change the instrument from said second mode of operation to said first mode of operation; and
(c) operating said multi-function, multi-mode switch for a third period of time, so as to change the instrument between said primary and secondary functions.

13. A method according to claim 12 further comprising the steps of providing feedback when the instrument changes between said primary and secondary functions, from said first mode of operation to said second mode of operation, and from said second mode of operation to said first mode of operation.

* * * * *